United States Patent [19]

Grassi

[11] 4,328,898
[45] May 11, 1982

[54] FRAME FOR STORING PRINTED-CIRCUIT BOARDS OR THE LIKE

[75] Inventor: Francesco Grassi, Milan, Italy

[73] Assignee: Società Italiana Telecomunicazioni Siemens S.p.A., Milan, Italy

[21] Appl. No.: 100,268

[22] Filed: Dec. 4, 1979

[51] Int. Cl.³ .......................... H02B 1/04; H02B 1/02; H05K 7/18
[52] U.S. Cl. ...................................... 211/41; 312/221; 339/17 M; 339/17 LM
[58] Field of Search .................. 211/41; 312/222, 221, 312/323, 215, 183, 16, 9; 52/716; 339/17 M, 17 LM

[56] References Cited

U.S. PATENT DOCUMENTS

| | | | |
|---|---|---|---|
| 1,378,285 | 5/1921 | Schwartz | 312/221 |
| 3,184,069 | 5/1965 | Rosenberg | 211/41 |
| 3,465,891 | 9/1969 | De Rose | 211/41 |
| 3,723,823 | 3/1973 | Lit et al. | 211/41 |
| 3,810,433 | 5/1974 | Posner | 211/41 |
| 3,838,777 | 10/1974 | Thornicroft | 211/41 |
| 3,878,438 | 4/1975 | Weisman | 211/41 |
| 3,899,721 | 8/1975 | Borchard | 211/41 |
| 4,022,326 | 5/1977 | Marconi | 211/41 |
| 4,098,046 | 7/1978 | Papa | 211/41 |
| 4,214,292 | 7/1980 | Johnson | 211/41 |
| 4,232,356 | 11/1980 | Saunders | 211/41 |

FOREIGN PATENT DOCUMENTS 1578065 7/1969 France ............................. 211/41 A

*Primary Examiner*—Reinaldo P. Machado
*Attorney, Agent, or Firm*—Karl F. Ross

[57] ABSTRACT

A prismatic frame designed to hold a multiplicity of flat articles such as printed-circuit boards has two generally rectangular end walls interconnected by two coplanar pairs of cross-members each having a narrow face with a row of perforations receiving locator pins of guide elements spanning each pair of cross-members, the guide elements being provided with longitudinal channels accommodating respective boards. The guide elements are held in position by retaining bars confronting the perforated faces of one cross-member of each pair, at least one of these bars forming a guidetrack for a locking rod which has teeth alignable with the boards in a blocking position and is shiftable into an unblocking position facilitating their withdrawal.

8 Claims, 6 Drawing Figures

4,328,898

FRAME FOR STORING PRINTED-CIRCUIT BOARDS OR THE LIKE

FIELD OF THE INVENTION

My present invention relates to a frame or container designed for the parallel storage of a multiplicity of flat articles, especially printed-circuit boards.

BACKGROUND OF THE INVENTION

Frames of this type, e.g. as known from U.S. Pat. No. 3,723,823, are of generally prismatic configuration and comprise two substantially rectangular end walls interconnected at their corners by four elongate cross-members with confronting surfaces lying in two parallel planes. The coplanar surfaces of each pair of cross-members support a set of guide elements which form track channels designed to receive opposite edges of a printed-circuit board or other article to be inserted therebetween. Obviously, these confronting supporting surfaces must be spaced apart by a distance exceeding the dimension of the articles in a direction perpendicular thereto, i.e. their height in case the supporting surfaces are substantially horizontal.

In such a frame it is, of course, necessary to prevent the untimely separation of any inserted article from its guide elements. Various means have heretofore been proposed for this purpose, including the use of guide bars with ribs arranged in a herringbone pattern, as disclosed in commonly owned U.S. Pat. No. 4,098,046, or the provision of a spring-loaded detent for latching adjoining container walls to each other, as described in Italian utility model No. 119,387.

OBJECTS OF THE INVENTION

The general object of my present invention is to provide a simplified frame structure for the purpose set forth, particularly for the storage of a large number of printed-circuit boards or the like.

A more specific object is to provide simple and easily manipulable means for retaining the stored articles in place while allowing their selective withdrawal and insertion.

SUMMARY OF THE INVENTION

In accordance with my present invention, the guide elements and the cross-members supporting same are provided with interlocking formations enabling separation thereof by a displacement of the guide elements transverse to the associated cross-members. Such displacement, however, is normally prevented by first and second retaining means respectively adjoining one of the cross-members of each of the two pairs of such members supporting the two sets of guide elements. It should be noted, however, that the frame according to my invention may be extended through the use of additional cross-members and associated retaining means to accommodate two or more tiers of printed-circuit boards or the like; in that case an intermediate pair of cross-members may be engaged on opposite sides by two sets of guide elements as more fully described hereinafter.

Pursuant to a more particular feature of my invention, the retaining means are in the form of bars paralleling respective faces of the adjoining cross-members. These bars, besides serving to prevent separation of the assembled cross-members and guide elements, advantageously act as guides for locking means slidable thereon between an unblocking position, facilitating insertion and removal of a printed-circuit board or similar article, and a blocking position preventing such insertion and removal. The locking means, in accordance with a more specific feature of my invention, may comprise a rod substantially coextensive with its retaining bar and provided with a multiplicity of lugs which are aligned in the blocking position with the track channels of the associated guide elements and are disaligned therefrom in the unblocking position.

BRIEF DESCRIPTION OF THE DRAWING

The above and other features of my present invention will now be described in detail with reference to the accompanying drawing in which.

SPECIFIC DESCRIPTION

Figure 1:
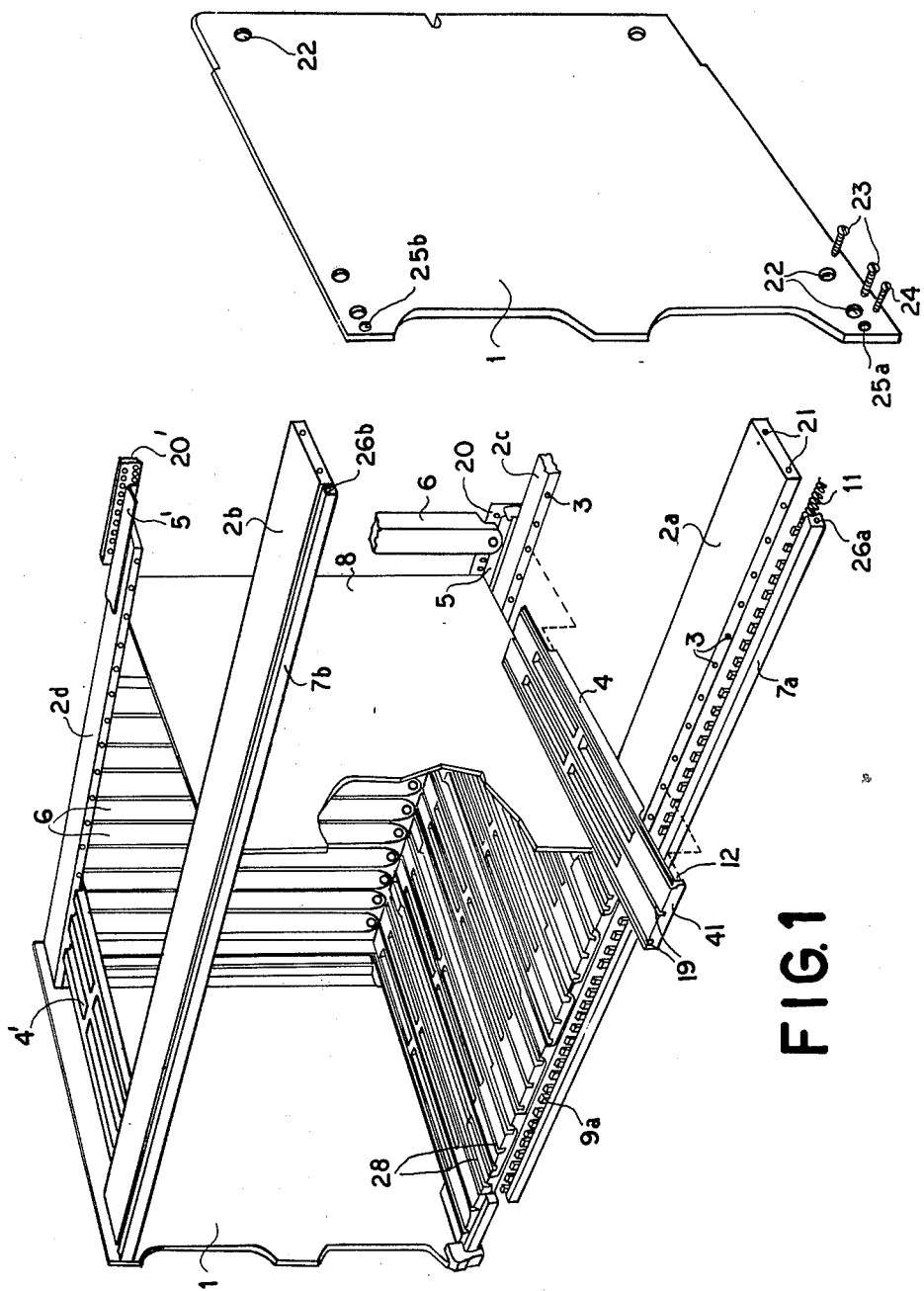
FIG. 1 is an exploded perspective view of a storage frame embodying my invention.

The storage frame shown in FIG. 1 comprises two generally rectangular end walls or panels 1 interconnected at their corners by four cross-members 2a–2d, e.g. of aluminum. It will be noted that these cross-members are in the shape of flat webs or bars, readily available on the market, in lieu of the more involved profiles conventionally used for this purpose. One or two bores 21 at either end of each cross-member are aligned with holes 22 on each end plate for the passage of screws 23 securing these members and end plates to one another.

Figure 2:
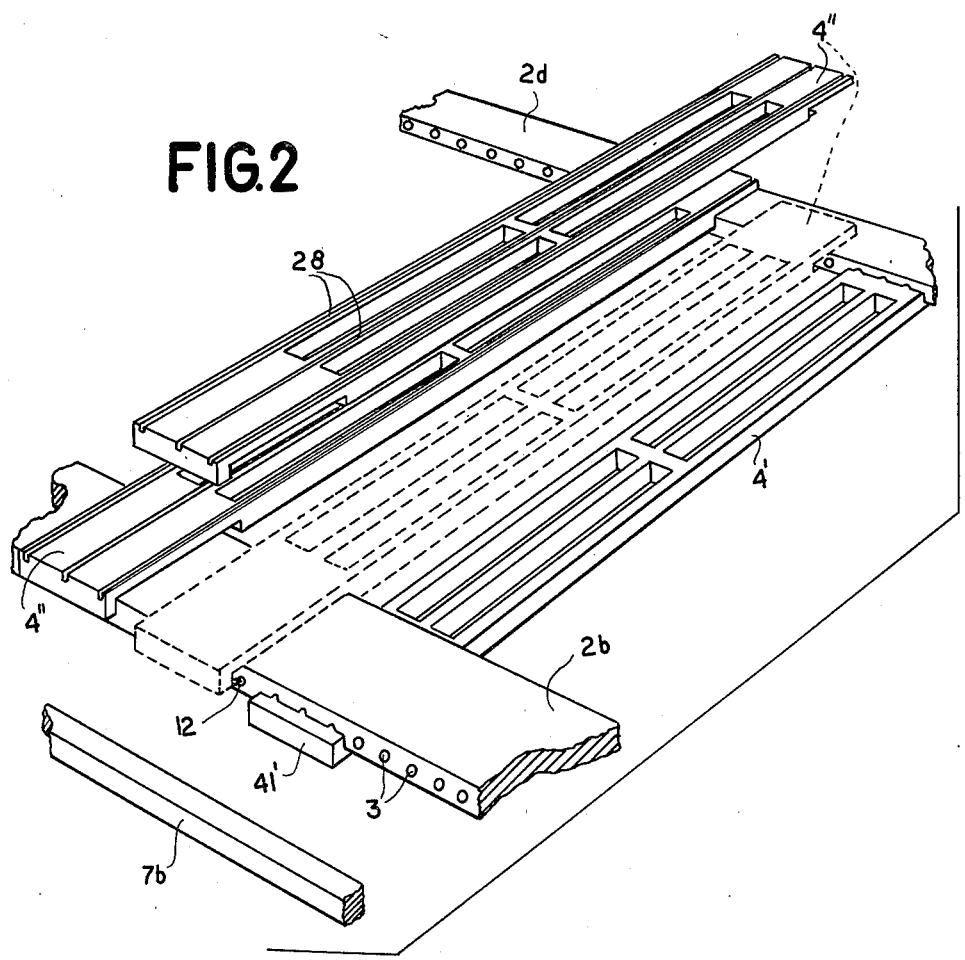
FIG. 2 is a fragmentary perspective view of certain components of the frame assembly shown in FIG. 1.
Figure 3:
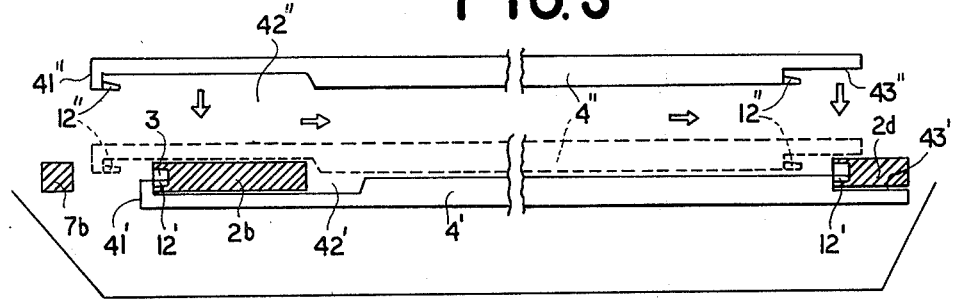
FIG. 3 is a side-elevational view of two guide elements engaging opposite supporting surfaces of a pair of coplanar cross-members of the frame assembly.

The narrow longitudinal face of each cross-member 2a–2d is provided with a multiplicity of equispaced perforations 3 accommodating prongs 12 on overhanging portions 41, 41' (see also FIGS. 2 and 3) of associated guide elements 4 and 4', the lower elements 4 resting on upper supporting surfaces of members 2a, 2c whereas the upper guide elements 4' are in contact with lower supporting surfaces of members 2b and 2d. These two sets of guide elements 4 and 4' have confronting track channels 28 accommodating lower and upper edges of inserted printed-circuit boards 8 (only one shown). FIGS. 2 and 3 also show several guide elements 4", forming part of a third set, which overlie the cross-members 2b and 2d and whose channels 28 may receive the lower edges of a second tier of printed-circuit boards 8, provided of course that the end walls 1 be replaced by taller panels to which a third pair of cross-members may be secured in order to define with members 2b and 2d another compartment similar to that formed between members 2a–2d.

As best seen in FIG. 3, the perforations 3 of cross-members 2b and 2d (which may be identical with those of members 2a and 2c) are in the form of blind frusto-conical bores each capable of being simultaneously occupied by a prong 12' of an underlying guide member 4' and a prong 12" of an overlying guide member 4". These prongs, therefore, are more or less complementary segments of a frustocone, preferably extending over less than 180°, cut away along axially extending planes that are flush with adjoining edges of overhanging end portions 41', 41" carrying these prongs. The confronting sides of guide elements 4' and 4" are recessed at 42', 42" as well as at 43', 43" to a depth less than half the thickness of cross-members 2b and 2d so that each of these guide elements may fully come to rest against the corresponding supporting surfaces of these cross-members. It will also be noted that the width of recesses 42' and 42" exceeds that of cross-member 2b by more than the length of prongs 12', 12" in order to let these prongs enter into the corresponding bores 3 by a longitudinal shift of each guide element. The same applies, of course, to the similarly recessed lower guide elements 4 (FIG. 1) which, for mass-production purposes, are preferably of the same shape as elements 4' and 4".

The rear cross-members 2c and 2d are provided with respective angle pieces 5 and 5' by which they are anchored to mounting bars 6 and terminal strips 20, 20' establishing electrical connections between the printed-circuit boards 8 and an associated wire harness as is well known per se. Because of this additional support, the two rear members may be narrower than the front members 2a and 2b, as shown.

After all the guide elements have been assembled with their respective cross-members by the interlocking of their prongs with perforations 3, the engagement is maintained with the aid of retaining bars 7a and 7b respectively confronting the perforated faces of cross-members 2a and 2b. These retaining bars may be secured to the associated cross-members in any suitable manner, e.g. with the aid of screws 24 which pass through holes 25a, 25b in end walls 1 and are threaded into bores 26a, 26b of the bars.

Figure 4:
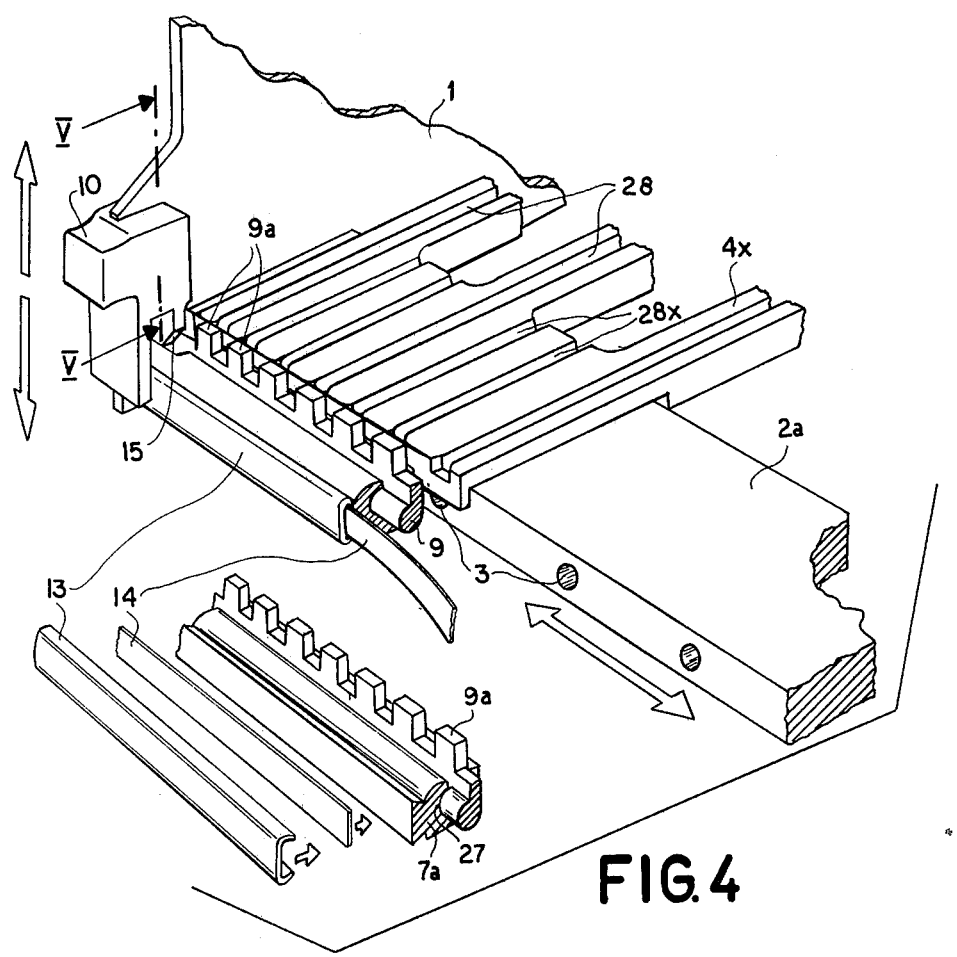
FIG. 4 is another fragmentary perspective view, partly exploded, illustrating a retaining bar and a locking rod associated with one of the cross-members.

Whereas the upper retaining bar 7b is shown to have a square profile, the lower bar 7a has a concave side forming a guide channel 27 (FIG. 4) for a locking rod 9 having crenellated lugs 9a whose spacing corresponds to that of the perforations 3 of members 2a. Bar 7a is further shown to have a dovetail profile engageable by an elongate transparent clip 13 overlying a strip 14 of paper or the like, this strip serving as an information carrier identifying the several printed-circuit boards 8. Components 7a, 9, 13 and 14 have been shown partly broken off and relocated in FIG. 4 for greater clarity. It will also be noted that, in FIG. 4, the guide elements 4 of FIG. 1 have been replaced by somewhat different elements 4x supported by cross-member 2a, these elements 4x having foreshortened additional channels 28x besides the track channels 28.

Figure 5A:
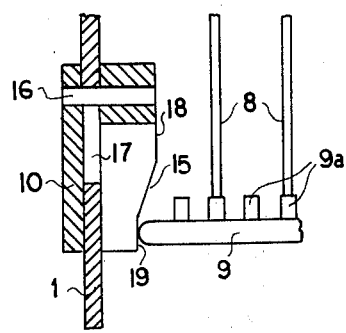
FIGS. 5A and 5B are fragmentary cross-sectional views, taken on the line V—V of FIG. 4, showing details of a camming device for control of the locking rod.
Figure 5B:
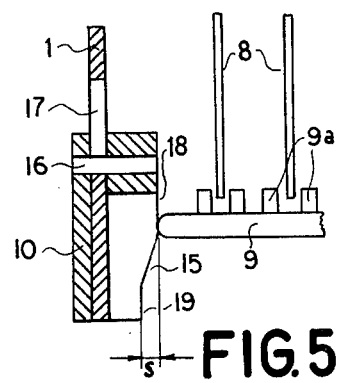

The right-hand end of locking rod 9, as viewed in FIG. 1, carries a coil spring 11 which is received in guide channel 27 and bears upon a solid portion of the adjacent end wall 1 so as to urge the rod 9 toward the left, i.e. into a blocking position from an unblocking position in which its crenellations 9a are offset from the track channels 28 whereby boards 8 may be freely inserted and withdrawn. The opposite end of rod 9 bears upon a control element 10 which is vertically slidable along an edge of the corresponding end wall 1 between an upper position (FIG. 5A) and a lower position (FIG. 5B). The stroke of control element 10 is limited by a slot 17 in panel 1 which is traversed by a pin 16. An edge of that element, facing the opposite wall, has two vertical portions 18 and 19 interconnected by a ramp 15, that edge being in contact with the left-hand end of rod 9. In the normal or blocking position of FIG. 5A, rod 9 is aligned with edge portion 19 against which it is pressed by the coil spring 11 of FIG. 1; the lugs 9a then obstruct the channels 28 to lock in the boards 8 received in these channels.

The user, wishing to withdraw any of these boards or insert others, depresses the control element 10 into its alternate or unblocking position shown in FIG. 5B whereby ramp 15 cams the rod 9 rightward against the counteracting force of spring 11 until edge portion 18 abuts the rod so as to align the boards 8 with the gas separating the lugs 9a. Thus, the stroke s of rod 9 corresponds to half the pitch of these lugs.

It will be apparent that the boards 8 are not subjected to any bending or twisting stress during insertion, storage or withdrawal. Thus, they can be made of relatively inelastic, rigid material and can be firmly seated in their respective track channels.

I claim:

1. A frame for the parallel storage of a multiplicity of flat articles, comprising:
    a pair of spaced-apart end walls;
    a first and a second pair of elongate cross-members with coplanar supporting surfaces interconnecting said end walls, the supporting surfaces of said pairs confronting each other and being spaced apart by a distance exceeding a dimension of said articles perpendicular thereto;
    a first and a second set of guide elements respectively spanning the cross-members of said first and said second pair along their supporting surfaces, respective guide elements of said sets being provided with confronting track channels for receiving opposite edges of an article to be inserted therebetween, said guide elements and said cross-members being provided with interlocking formations enabling separation thereof by a displacement transverse to said cross-members; and
    first and second retaining bars paralleling adjoining faces of respective cross-members of said first and second pairs for preventing said transverse displacement, thereby holding said guide elements engaged with said cross-members, said formations including a multiplicity of perforations on said faces and projections on overhanging portions of said guide elements protruding between said bars and said faces, said overhanging portions extending over not more than half the width of said faces, said projections occupying not more than half the cross-sections of said perforations for enabling engagement of said cross-members by a further, symmetrical set of guide elements on opposite surfaces of said cross-members.

2. A frame for the parallel storage of a multiplicity of flat articles, comprising:
    a pair of spaced-apart end walls;
    a first and a second pair of elongate cross-members with coplanar supporting surfaces interconnecting said end walls, the supporting surfaces of said pairs confronting each other and being spaced apart by a distance exceeding a dimension of said articles perpendicular thereto;
    a first and a second set of guide elements respectively spanning the cross-members of said first and said second pair along their supporting surfaces, respective guide elements of said sets being provided with confronting track channels for receiving opposite edges of an article to be inserted therebetween, said guide elements and said cross-members being provided with interlocking formations enabling separation thereof by a displacement transverse to said cross-members;

first and second retaining bars paralleling adjoining faces of respective cross-members of said first and second pairs for preventing said transverse displacement, thereby holding said guide elements engaged with said cross-members; and locking means slidably guided on at least one of said bars between an unblocking position facilitating insertion and removal of articles and a blocking position preventing such insertion and removal.

3. A frame as defined in claim 1 wherein said formations include a multiplicity of perforations on said faces and projections on overhanging portions of said guide elements protruding between said bars and said faces.

4. A frame as defined in claim 3 wherein said overhanging portions extend over not more than half the width of said faces, said projections occupying not more than half the cross-sections of said perforations for enabling engagement of said cross-members by a further, symmetrical set of guide elements on opposite surfaces of said cross-members.

5. A frame as defined in claim 1, 3 or 4 wherein said locking means comprises a rod substantially coextensive with said one of said bars and provided with a multiplicity of lugs aligned in said blocking position with the track channels of the associated guide elements.

6. A frame as defined in claim 5, further comprising cam means on one of said end walls movable to shift said rod into one of said positions, and counteracting spring means at the other of said end walls bearing upon said rod for urging same into the other of said positions.

7. A frame as defined in claim 1, 3 or 4 wherein at least one of said bars is provided with an information carrier identifying the inserted articles.

8. A frame as defined in claim 7, further comprising an elongate transparent clip removably engaging said one of said bars on a side remote from the adjoining cross-member, said information carrier being a strip interposed between said one of said bars and said clip.

* * * * *